United States Patent
Wang et al.

(10) Patent No.: US 8,440,550 B2
(45) Date of Patent: May 14, 2013

(54) METHOD FOR FORMING STRAINED LAYER WITH HIGH GE CONTENT ON SUBSTRATE AND SEMICONDUCTOR STRUCTURE

(75) Inventors: Jing Wang, Beijing (CN); Jun Xu, Beijing (CN); Lei Guo, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/126,730

(22) PCT Filed: Nov. 29, 2010

(86) PCT No.: PCT/CN2010/079247
§ 371 (c)(1),
(2), (4) Date: Apr. 28, 2011

(87) PCT Pub. No.: WO2012/000284
PCT Pub. Date: Jan. 5, 2012

(65) Prior Publication Data
US 2012/0007146 A1    Jan. 12, 2012

(30) Foreign Application Priority Data
Jun. 29, 2010   (CN) .......................... 2010 1 0212085

(51) Int. Cl.
*H01L 29/78*   (2006.01)
*H01L 21/20*   (2006.01)
*H01L 21/265*  (2006.01)

(52) U.S. Cl.
USPC .............. 438/488; 257/E21.334; 257/E21.09; 257/E29.255; 257/192

(58) Field of Classification Search .................. 257/192, 257/E21.334, E21.09, E29.255; 438/458
See application file for complete search history.

(56) References Cited

U.S. PATENT DOCUMENTS

| | | | |
|---|---|---|---|
| 6,372,593 B1 | 4/2002 | Hattori | |
| 6,893,936 B1 | 5/2005 | Chen et al. | |
| 7,791,107 B2 * | 9/2010 | Gupta et al. | 257/192 |
| 2003/0119280 A1 * | 6/2003 | Lee et al. | 438/459 |
| 2005/0093100 A1 | 5/2005 | Chen et al. | |
| 2008/0070397 A1 * | 3/2008 | Lochtefeld et al. | 438/597 |

FOREIGN PATENT DOCUMENTS

| | | |
|---|---|---|
| CN | 1875473 A | 12/2006 |
| CN | 1954421 A | 4/2007 |
| CN | 101882624 A | 11/2010 |

OTHER PUBLICATIONS

Patent Cooperation Treaty, PCT International Search Report Issued in Connection with International Application No. PCT/CN2010/079247; Apr. 7, 2011; 5 pages.
Patent Cooperation Treaty, PCT Written Opinion of the International Searching Authority Issued in Connection with International Application No. PCT/CN2010/079247; Apr. 7, 2011; 5 pages.

* cited by examiner

*Primary Examiner* — Victor A Mandala
*Assistant Examiner* — Whitney T Moore
(74) *Attorney, Agent, or Firm* — Greenberg Traurig, LLP

(57) ABSTRACT

A semiconductor structure and a method for forming the same are provided. The semiconductor structure may comprise a substrate (110); an insulation layer (120) formed on the substrate (110); a strained layer (130) formed on the insulation layer (120); a strained layer (140) with high Ge content formed on the strained layer (130); and a gate stack (160) formed on the strained layer (140) with high Ge content.

4 Claims, 3 Drawing Sheets

METHOD FOR FORMING STRAINED LAYER WITH HIGH GE CONTENT ON SUBSTRATE AND SEMICONDUCTOR STRUCTURE

CROSS-REFERENCE TO RELATED APPLICATIONS

This patent application is a §371 national stage patent application based on International Patent Application No. PCT/CN2010/079247, filed Nov. 29, 2010, entitled "METHOD FOR FORMING STRAINED LAYER WITH HIGH GE CONTENT ON SUBSTRATE AND SEMICONDUCTOR STRUCTURE," which claims priority to Chinese Patent Application Number 201010212085.1, filed on Jun. 29, 2010, which are both incorporated herein by reference in their entirety.

FIELD

The present disclosure relates to semiconductor manufacture and design, and more particularly to a method for forming a strained layer with high Ge content on a substrate and a semiconductor structure.

BACKGROUND

Recently, in an integrated circuit, silicon on insulator (SOI) substrate has been used instead of a silicon substrate to decrease a parasitic capacitance between a drain and a substrate in a transistor, thus enhancing a performance of a semiconductor integrated circuit.

However, with a continuous scaling down of a semiconductor device size, a size of a single transistor has gradually reached a physical limit thereof, and therefore a CMOS device with silicon as a channel material has a lowered mobility, which may not meet a performance improvement of the semiconductor device. In order to solve this problem, conventionally, strained silicon techniques are adopted to improve the mobility of silicon, or other materials with higher mobility are used to replace the silicon as the channel material for the device, among which Ge has obtained more attention because of its high hole carrier mobility. The hole carrier mobility of Ge or SiGe with high Ge content is much higher than that of the silicon, and consequently may be used for fabricating a PMOS device by using a CMOS process.

Therefore, conventionally, an insulation layer, for example, a $SiO_2$ layer, has been used in a Ge device to improve the performance of the semiconductor device. For example, a Ge layer is formed directly on the insulation layer as the channel layer.

Conventionally, an interface between the insulation layer and the Ge layer has a poor interface state, which may cause serious scattering and leakage and consequently may influence the performance of the device.

SUMMARY

The present disclosure is aimed to solve at least one of the above mentioned technical problems, particularly the problem of an interface state at an interface between an insulation layer and a high Ge content layer.

According to an aspect of the present disclosure, a semiconductor structure is provided. The semiconductor structure may comprise a substrate; an insulation layer formed on the substrate; a strained layer formed on the insulation layer; a strained layer with high Ge content formed on the strained layer; and a gate stack formed on the strained layer with high Ge content.

In one embodiment, a strained silicon layer or a strained SiGe layer with low Ge content may be formed on the strained layer with high Ge content to form a Si—Ge—Si structure, thus not only alleviating the problem of BTBT (Band To Band Tunneling) leakage, but also alleviating the problem of an interface state at an interface between a gate dielectric layer and a channel layer.

According to another aspect of the present disclosure, a method for forming a semiconductor structure is provided. The method may comprise providing a first wafer comprising a first substrate and a relaxed SiGe layer formed on the first substrate; forming a strained layer on the relaxed SiGe layer; implanting H (hydrogen) ions to form an H ion implanting layer below the strained layer; flipping the first wafer and the strained layer and bonding the strained layer to a second wafer, wherein the second wafer comprises a second substrate and an insulation layer formed on the second substrate; stripping the first wafer by annealing; and forming the strained layer with high Ge content on the strained layer.

In one embodiment, the strained layer may be repeatedly formed on the relaxed SiGe layer, thus greatly reducing the fabrication cost.

According to an embodiment of the present disclosure, the strained layer is formed between the insulation layer and the strained layer with high Ge content, thus effectively alleviating the problem of an interface state at an interface between the insulation layer and the strained layer with high Ge content.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF EMBODIMENTS OF THE DISCLOSURE

Figure 1:
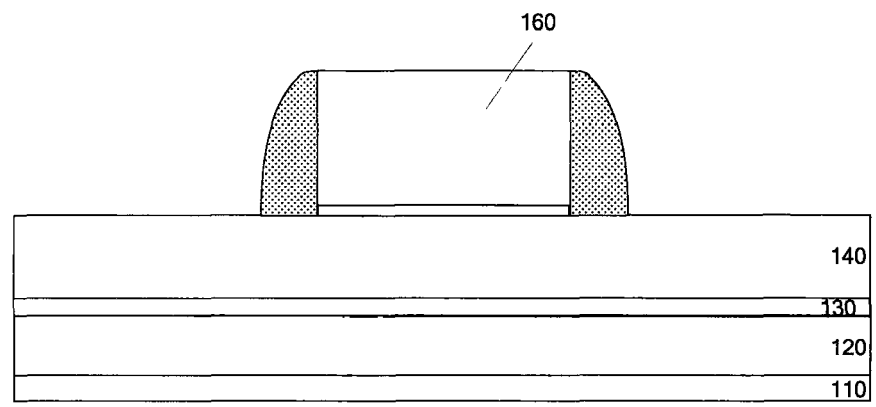
FIG. 1 is a cross-sectional view of a semiconductor structure with a strained layer of high Ge content formed on a substrate according to a first embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

FIG. 1 is a cross-sectional view of a semiconductor structure with a strained layer of high Ge content formed on a substrate according to a first embodiment of the present disclosure. The semiconductor structure may comprise a substrate 110, such as a silicon layer; an insulation layer 120, such as a $SiO_2$ layer, formed on the substrate 110; a strained layer 130 formed on the insulation layer 120; a strained layer 140 with high Ge content formed on the strained layer 130; and a gate stack 160 formed on the strained layer 140 with high Ge content. In one embodiment, the strained layer 140 with high Ge content may comprise a Ge layer or a SiGe layer with high Ge content, and the strained layer 130 may comprise a strained silicon layer or a strained SiGe layer with low Ge content. Preferably, the strained layer 130 may have a thickness within a range about from 3 nm to 50 nm.

Figure 2:
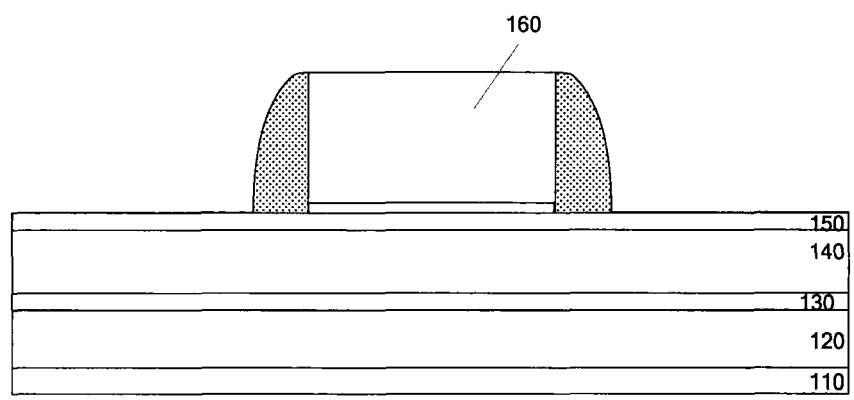
FIG. 2 is a cross-sectional view of a semiconductor structure with a strained layer of high Ge content formed on a substrate according to a second embodiment of the present disclosure.

In one preferred embodiment, as shown in FIG. 2, a strained silicon layer 150 or a strained SiGe layer 150 with low Ge content may be formed on the strained layer 140 with high Ge content to form a Si—Ge—Si structure, thus not only alleviating the problem of BTBT leakage, but also alleviating the problem of an interface state at an interface between a gate dielectric layer and a channel layer.

In order to better understand the semiconductor structure according to an embodiment of the present disclosure, a method for forming the semiconductor structure described above is also provided. It should be noted that the semiconductor structure may be fabricated through various technologies, such as different types of product lines or different processes. However, if the semiconductor structures fabricated through various technologies have substantially the same structure and technical effects as those of the present disclosure, they should be within the scope of the present disclosure. In order to better understand the present disclosure, the method for forming the semiconductor structure of the present disclosure described above will be described in detail below. Moreover, it should be noted that the following steps are described only for exemplary and/or illustration purpose rather than for limitations. Other technologies may be adopted by those skilled in the art to form the semiconductor structure of the present disclosure described above.

FIGS. 3-9 are flow charts of a method for forming a strained layer with high Ge content on a substrate according to an embodiment of the present disclosure. The method may comprise the following steps.

Figure 3:
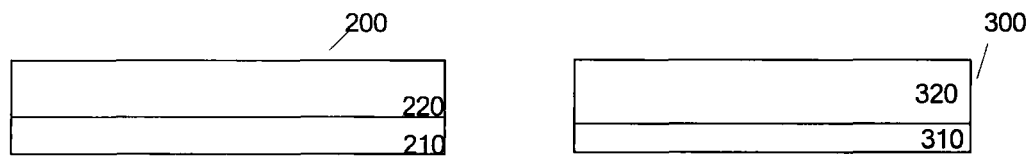
FIGS. 3-9 are flow charts of a method for forming a strained layer of high Ge content on a substrate according to an embodiment of the present disclosure.

Step S101, a first wafer 200 and a second wafer 300 are provided respectively. The first wafer 200 may comprise a first substrate 210 and a relaxed SiGe layer 220 formed on the first substrate 210, as shown in FIG. 3. For example, the first substrate 210 may be a silicon substrate. The second wafer 300 may comprise a second substrate 310 and an insulation layer 320 such as a $SiO_2$ layer, formed on the second substrate 310, as shown in FIG. 3.

Figure 4:
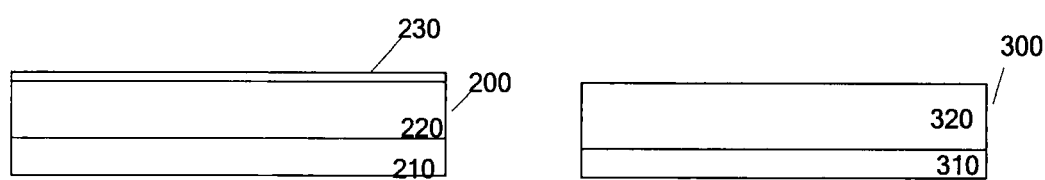

Step S102, a strained layer 230 is formed on the relaxed SiGe layer 220. Preferably, the strained layer 230 may have a thickness within a range about from 3 nm to 50 nm, as shown in FIG. 4. In one embodiment, the strained layer 230 may comprise a strained silicon layer or a strained SiGe layer with low Ge content.

Figure 5:
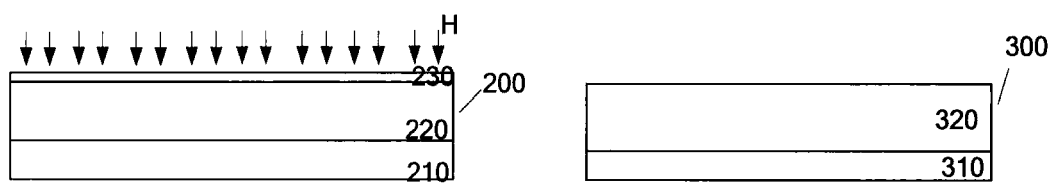

Step S103, high-concentration H ions are implanted to form a high-concentration H-ion implanting layer below the strained layer 230, as shown in FIG. 5. In other embodiments, an H-ion-containing substance, such as a mixture of H ions and He or H ions and Ar, may be implanted. Certainly, those skilled in the art may select other H-ion-containing substances to implant, which may also be within the scope of the present disclosure.

Figure 6:
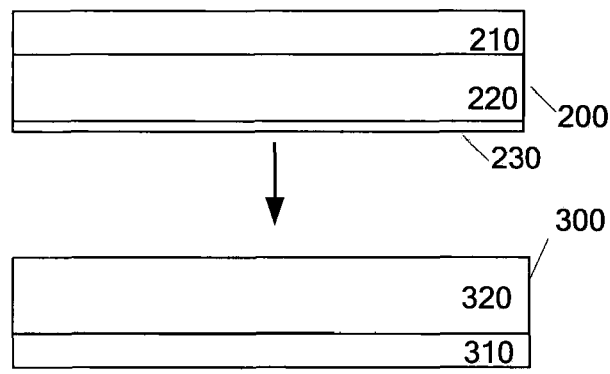

Step S104, the first wafer 200 and the strained layer 230 are flipped and the strained layer 230 is bonded to a second wafer 300, as shown in FIG. 6.

Figure 7:
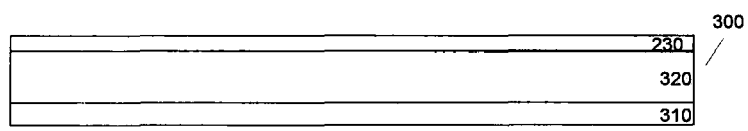

Step S105, annealing is performed and the first wafer 200 is stripped, as shown in FIG. 7. For example, the first wafer 200, the strained layer 230 and the second wafer 300 are heated to about 400-600° C. to break Si bonds at the H-ion implanting layer, thus cutting the relaxed SiGe layer 220 from the strained layer 230 at the H-ion implanting layer and consequently stripping the first wafer 200. Alternatively, with a microwave-assisted heating technology, the first wafer 200, the strained layer 230 and the second wafer 300 are heated to above 200° C., and the first wafer 200 is subjected to a microwave radiation to break the Si bonds at the H-ion implanting layer at a lower temperature, thus cutting the relaxed SiGe layer 220 from the strained layer 230 at the H-ion implanting layer and consequently stripping the first wafer 200. In one embodiment, the H-ion implanting layer may be just formed between the relaxed SiGe layer 220 and the strained layer 230 by precisely controlling the H-ion implanting. Certainly, the H-ion implanting layer may also be formed in the strained layer 230 or in the relaxed SiGe layer 220. When the H-ion implanting layer is formed in the relaxed SiGe layer 220, after the relaxed SiGe layer 220 is cut at the H-ion implanting layer, SiGe materials remained on the strained layer 230 may be removed by a chemical mechanical polishing process, for example. Certainly, other suitable processes may be adopted to remove the SiGe materials remained on the strained layer 230.

Figure 8:
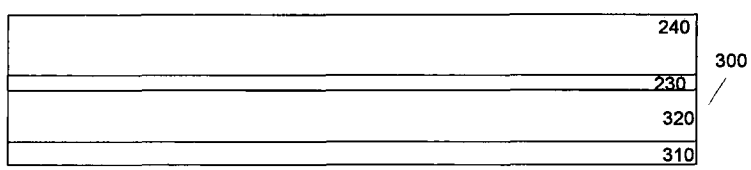

Step S106, the strained layer 240 with high Ge content is formed on the strained layer 230, as shown in FIG. 8. In one embodiment, the strained layer 240 with high Ge content may comprise a Ge layer or a SiGe layer with high Ge content.

Figure 9:
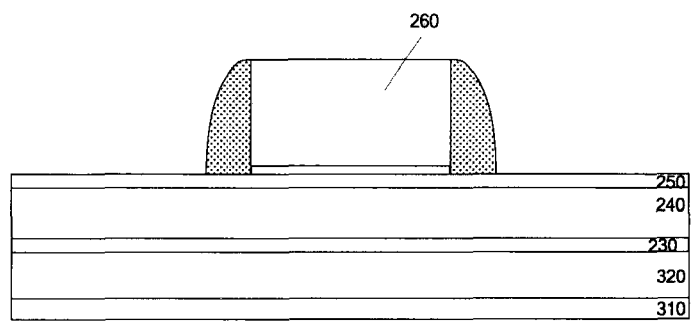

Step S107, preferably, a strained silicon layer 250 or a strained SiGe layer 250 with low Ge content may be formed on the strained layer 240 with high Ge content, and a gate stack 260 may be formed on the strained silicon layer 250 or the strained SiGe layer 250 with low Ge content, as shown in FIG. 9. In one embodiment, the strained silicon layer 250 or the strained SiGe layer 250 with low Ge content may be formed by chemical vapor deposition.

In the above embodiments, the strained layer 230 may be repeatedly formed on the relaxed SiGe layer 220, and the relaxed SiGe layer 220 may be reused and then stripped, thus greatly reducing the fabrication cost.

According to an embodiment of the present disclosure, the strained layer is formed between the insulation layer and the strained layer with high Ge content, thus effectively alleviating the problem of an interface state at an interface between the insulation layer and the strained layer with high Ge content.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A method for forming a semiconductor structure, comprising steps of:
    providing a first wafer comprising a first substrate and a relaxed SiGe layer formed on the first substrate;
    forming a first strained layer on the relaxed SiGe layer, wherein the first strained layer comprises a first strained SiGe layer with low Ge content;
    implanting H ions to form an H-ion implanting layer below the first strained layer;
    flipping the first wafer and the first strained layer and bonding the first strained layer to a second wafer, wherein the second wafer comprises a second substrate and an insulation layer formed on the second substrate;
    stripping the first wafer by annealing;
    forming a second strained layer with high Ge content on the first strained layer; and
    forming a third strained layer on the second strained layer, wherein the third strained layer comprises a third strained SiGe layer with low Ge content, wherein the first, second, and third stained layers form a Si—Ge—Si structure.

2. The method according to claim 1, wherein the second strained layer with high Ge content comprises a Ge layer or a SiGe layer with high Ge content.

3. The method according to claim 1, wherein the first strained layer has a thickness within a range from 3 nm to 50 nm.

4. The method according to claim 1, after stripping the first wafer, further comprising a step of:
    forming a strained layer on the relaxed SiGe layer again to repeatedly form the strained layer and to reuse the relaxed SiGe layer.

* * * * *